United States Patent [19]

Benz et al.

[11] Patent Number: 5,187,424

[45] Date of Patent: Feb. 16, 1993

[54] PROCESS FOR DETERMINING THE STATE OF A BATTERY

[75] Inventors: Klemens Benz, Bellheim; Rainer Kübler, Stuttgart, both of Fed. Rep. of Germany

[73] Assignee: Mercedes-Benz AG, Stuttgart, Fed. Rep. of Germany

[21] Appl. No.: 801,623

[22] Filed: Dec. 4, 1991

Related U.S. Application Data

[63] Continuation of Ser. No. 596,399, Oct. 12, 1990.

[30] Foreign Application Priority Data

Oct. 14, 1989 [DE] Fed. Rep. of Germany ....... 3934353

[51] Int. Cl.[5] .......................................... H01M 10/44
[52] U.S. Cl. ....................................... 320/14; 320/44; 320/48
[58] Field of Search ............................ 320/14, 44, 48

[56] References Cited

U.S. PATENT DOCUMENTS

| | | | |
|---|---|---|---|
| 3,593,009 | 7/1971 | Scholl | 320/48 |
| 3,680,072 | 7/1972 | Charbonnier et al. | 320/48 |
| 3,857,087 | 12/1974 | Jones | 320/48 |
| 4,413,221 | 11/1983 | Benjamin et al. | 320/14 |
| 4,639,655 | 1/1987 | Westhaver et al. | 320/14 |
| 4,677,363 | 6/1987 | Kopmann | 320/44 |
| 4,775,827 | 10/1988 | Ijntema et al. | 320/44 |
| 4,806,840 | 2/1989 | Alexander et al. | 320/44 |

FOREIGN PATENT DOCUMENTS

| | | |
|---|---|---|
| 3108844 | 9/1982 | Fed. Rep. of Germany . |
| 3205390 | 11/1982 | Fed. Rep. of Germany . |
| 0465683 | 7/1975 | U.S.S.R. ............................... 320/14 |
| 2185326 | 7/1987 | United Kingdom .................. 320/48 |

OTHER PUBLICATIONS

Der Nickel-Cadmium Akkumulator-Anwendung-stechnisches Handbook-General Elec. Co., Pub. No. GET-3148AD.

Primary Examiner—Steven L. Stephan
Assistant Examiner—Thomas M. Dougherty
Attorney, Agent, or Firm—Evenson, Wands, Edwards, Lenahan & McKeown

[57] ABSTRACT

A process for determining the state of a battery by carrying out in a cycle, starting from a specific charging state of the battery, a charging operation and a discharging operation, each with a specific current, the cycle being terminated when the specific charging state is reached again, and the state of the battery being deduced from the difference between the time periods required for the charging operation and the discharging operation. Alternatively, from a specific charging state of the battery a discharge can be carried out, in order to determine the available capacity from the extracted charge.

24 Claims, 4 Drawing Sheets

PROCESS FOR DETERMINING THE STATE OF A BATTERY

This is a continuation of application Ser. No. 07/596,399, filed Oct. 12, 1990.

BACKGROUND AND SUMMARY OF THE INVENTION

The present invention relates to a process for determining the state of a battery in which there is a combination of a battery discharging operation by a specific current with a battery charging operation by a specific current, and in which a charging/discharging device is controlled in such a manner that the battery reaches a specific charging state, according to which the instantaneous terminal voltage $U_{act}$ is equal to a predeterminable reference value $U_{ref2}$, and in which a signal is generated when the battery has reached the specific charging state, in which the instantaneous terminal voltage $U_{act}$ is equal to the predeterminable reference value $U_{ref2}$.

A battery maintenance device is already known from German Patent Document DE 3,205,390 A1, and according to this document a battery is maintained by first charging it and then by discharging it with a preferably constant current to a predeterminable minimum value of the battery voltage and subsequently charging it again to the maximum value. For this, the battery capacity measured during the discharging operation is used as a criterion for the state of the battery to be maintained. This measured battery capacity is compared with the rated capacity, in order to reach a decision as to whether the battery is operative or not. This decision is indicated to the user of the battery maintenance device acoustically and/or visually. Furthermore, another process for determining the state of a battery is described, and in this process the battery is discharged down to the final discharge voltage, starting from the maximum terminal voltage obtainable. Subsequently, the battery is fed a charge quantity which corresponds to the total ampere-hour capacity of the battery. The state of the battery is derived by the measurement of suitable parameters.

Disadvantages arise in this known process, in that the battery is not tested and maintained with the discharge current that occurs during operation, with the result that a battery is still accepted as fault-free, even though, under some circumstances, it is already seen as no longer operative when loaded with higher currents.

The General Electric Company (in Germany: General Electric Plastics GmbH, Battery Department, D-609 Rüsselsheim, Eisenstr. 5) has published, under Publication Number GET-3148AD, a book entitled "Der Nickel Cadmium Akkumulator—Anwendungstechnisches Handbuch" [The nickel-cadmium accumulator—Practical manual]. From the second edition of this book it is known that the capacity of a battery decreases during its lifetime. It is also known from this book that the capacity of a battery decreases with an increasing discharge rate. Beyond these principles, this publication gives no indication as to how this knowledge can be used to advantage in the testing of batteries.

According to another known process for determining the state of a battery, German Patent Document DE-3,108,844 A1, a battery is discharged with a high discharge current. The terminal voltage of the battery is then measured during a time interval immediately after the discharge current has been cut off. The state of the battery is then deduced from the time trend of the terminal voltage in the regeneration phase of the battery.

An object of the present invention is to provide a process for testing a battery under conditions which correspond to the conditions of use of the battery, in order thereby to have the possibility of detecting a battery as inoperative in good time, and/or to test a battery which can no longer be charged to such an extent that it has the final charging voltage at its terminals.

This and other objects are achieved by the present invention which provides a process for determining the state of a battery comprising the steps of controlling a charging/discharging device to charge the battery to a specific charging state in which an instantaneous terminal voltage $U_{act}$ is equal to a predeterminable reference value $U_{ref2}$, generating a first signal when the battery has reached the specific charging state, and controlling the charging/discharging device as a function of the first signal such that, during a specific time period $t_1$, a specific current $I_1$ flows, the direction of the specific current $I_1$ corresponding to a discharging operation. A second signal is generated which controls the charging/discharging device such that a specific current $I_2$, the direction of the specific current $I_2$ corresponding to a charging operation, flows for a time period $t_2$ until the battery is again in the specific charging state. The time period $t_2$, during which the specific current $I_2$ flows, is measured. The measured data is fed to an evaluation unit in which an order of magnitude of the conversion of electrical energy into heat energy is deduced from a deviation of the time $t_2$ from the time $t_1$.

One of the advantages of the present invention in relation to the known state of the art are that the points of the characteristic line characterizing specific states of the battery can be selected so that they are located in regions in which the characteristic line has a very steep trend. In other words, because of the relatively steep trend of the characteristic line at this point, the terminal voltage can be assigned to a point on the characteristic line relatively easily.

For carrying out the process according to the invention, the charge fed to and extracted from the battery has to be determined. This is obtained by means of an integration of the current. This integration can take place by measuring the current by sensing, the measured values of the current and of the sensing frequency basically producing the values which are used for an approximation of the integral by means of one of the known sum formulas.

In that part of the process according to the invention designated by process cycle I, it is possible to test batteries which, when being charged, no longer reach the full final charging voltage. It is expedient, when carrying out this part of the process according to the invention, to set the charging and discharging current at the order of magnitude of the relatively frequently occurring maximum discharge current of the battery under normal operating conditions. In this part of the process according to the invention, a balance of the charge quantity fed to the battery in relation to that extracted from the battery is prepared during a charging/discharging cycle of the battery. The heat energy consumed in the battery during such a cycle can be deduced from the difference between these charge quantities.

In that part of the process according to the invention designated by process cycle II, a battery in a stage I in which the battery is fully charged, that is to say at its terminals the instantaneous voltage $U_{act}$ is equal to the final charging voltage, is discharged with a discharge current considerably above its rated current. It is discharged until it has reached a state II, in which, at the terminals of the battery, the instantaneous voltage $U_{act}$ is equal to the final discharge voltage $U_{SE}$. The so-called "dynamic internal resistance" is thereby detected, that is to say, during discharge with the high discharge current, the conversion of electrical energy into heat energy in the battery, clearly greater at high discharge currents, is taken into account. An indication of the capacity, taking into account the conditions of use of the battery is thereby made. In the process according to the invention, an appropriate order of magnitude for the discharge current can be in a range of approximately 50 times the rates current of the battery. For a different load of the battery in the operating state, other discharge currents can also be appropriate for carrying out the process according to the invention.

In certain embodiments for carrying out the process according to the invention, the discharge current is set at the order of magnitude of the maximum discharge currents relatively frequently occurring under normal operating conditions. At the same time, in carrying out the process according to the invention account is taken of the fact that a battery regenerates after a high load, that is to say its terminal voltage increases again when a discharge current is no longer flowing. This can be taken into account by, after a loading of the battery, discharging the battery again with a high current after a regeneration phase $t_{delay}$, until it has reached the state II. The remaining capacity determined in this step is added to the capacity which was determined when the high current during the loading of the battery.

Other objects, advantages and novel features of the present invention will become apparent from the following detailed description of the invention when considered in conjunction with the accompanying drawings.

DETAILED DESCRIPTION OF THE DRAWINGS

Figure 1:
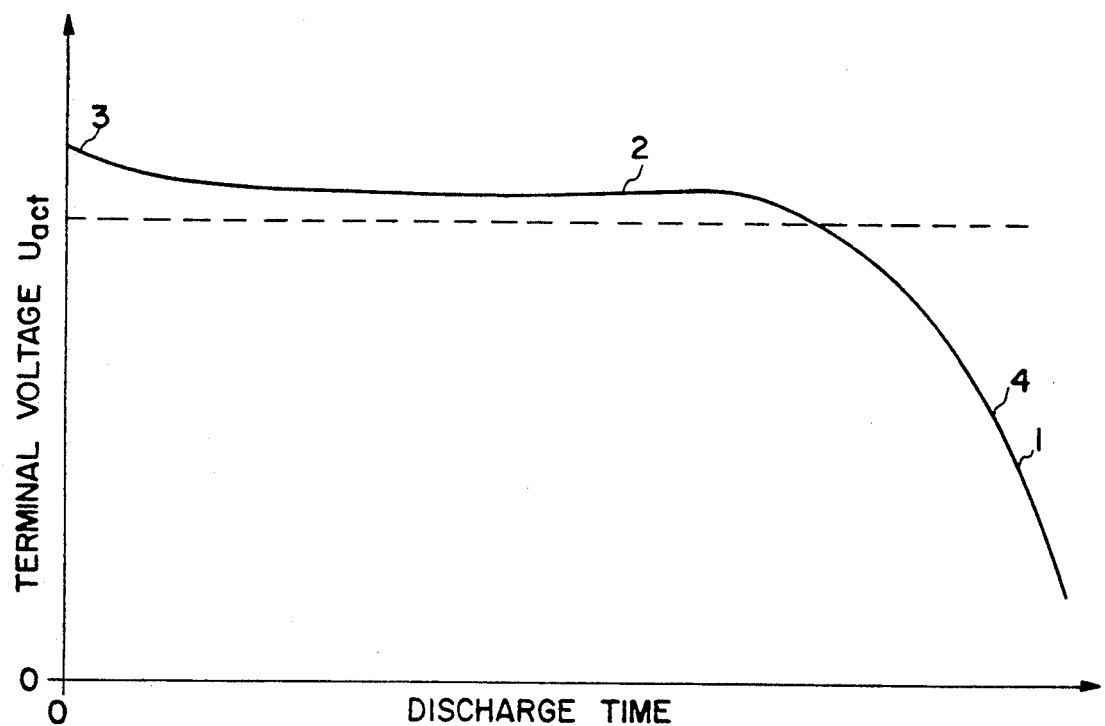
FIG. 1 shows a graph of the terminal voltage of a battery in time with a constant discharge current.

The graph shown in FIG. 1 indicates the trend of the terminal voltage of a battery in time during a discharge with a constant current. Point 3 is located on that part of the curve representing the state of the fully charged battery and corresponds to the final charging voltage. Point 2 is located on that part of the curve representing the terminal voltage of the battery in a normal operating state. Point 1 is located on that part of the curve representing the discharge state of the battery. Point 1 of the curve can be used as the terminal voltage which represents the "specific charging state" of the battery when the process according to the invention is being carried out. Since the curve is steep at point 1, this point 1 can be approached relatively simply. However, another point of the curve can also be used for carrying out the process according to the present invention.

Figure 2A:
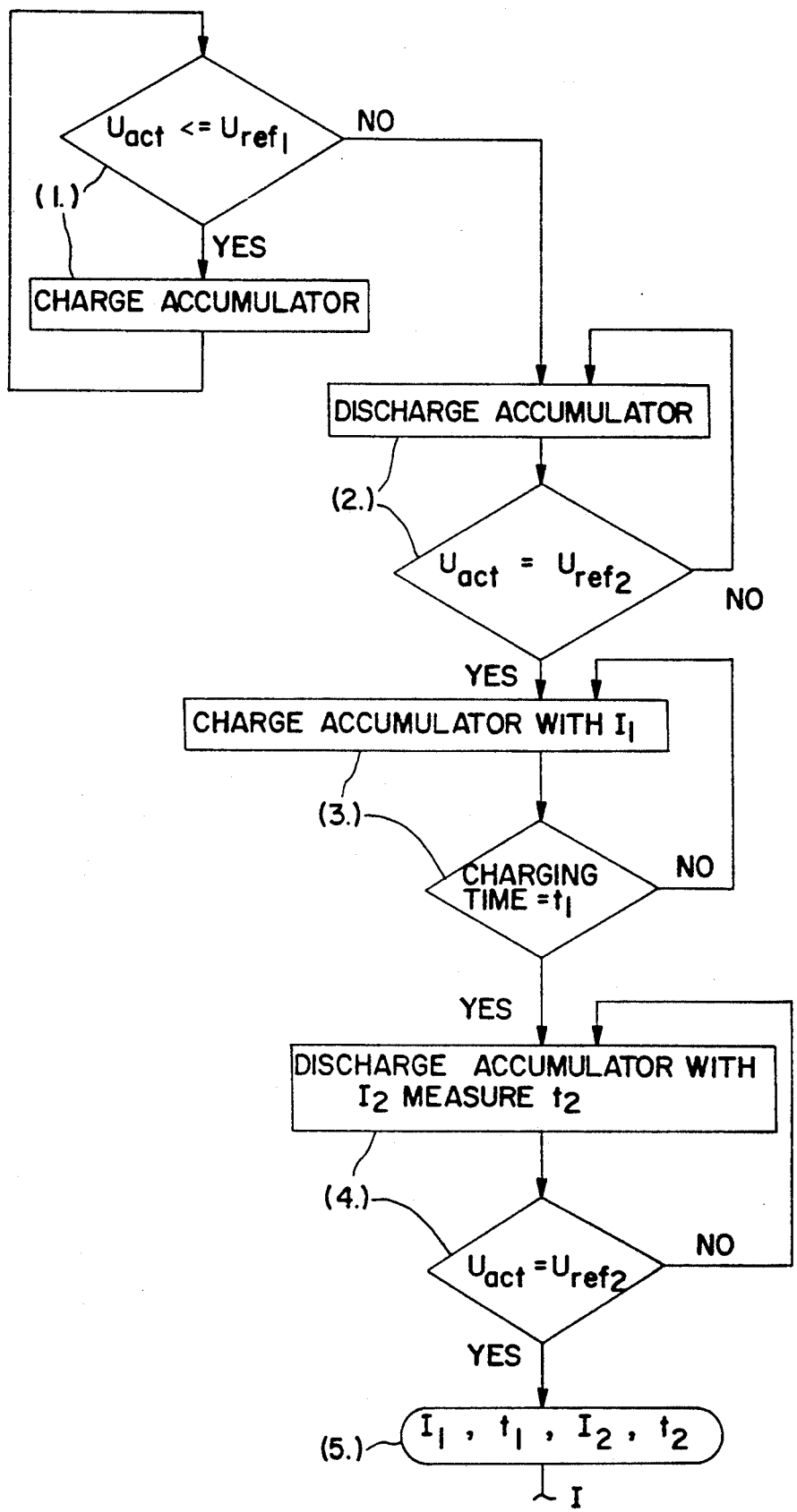
FIGS. 2a and 2b show a single flow diagram of process cycle I of the process according to a first embodiment of the present invention.
Figure 2B:
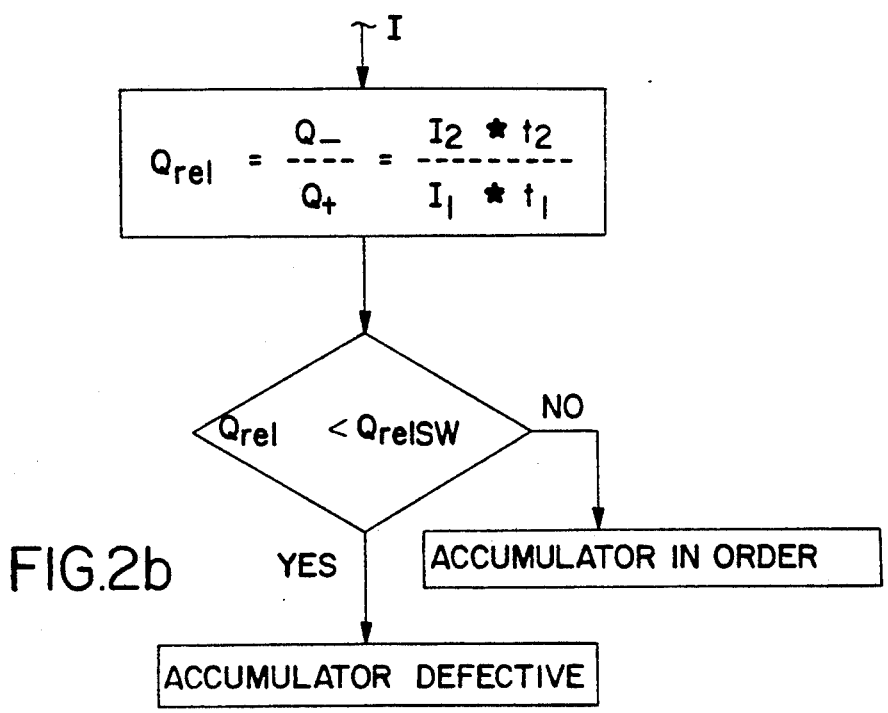

As is evident from the flow diagram shown in FIGS. 2a and 2b, in process cycle I a standard charging/discharging device that is used for carrying out the process according to the invention is controlled in such a way that the battery reaches a specific charging state. This specific charging state corresponds to a particular terminal voltage. For example, the charging state can be determined by measuring the terminal voltage of the battery. The terminal voltage characterizing the specific charging state is designated by $U_{ref2}$. Thus, point 1 in FIG. 1 can be used in order to define a charging state of the battery.

An embodiment of the conduct of process cycle I when the current $I_1$ is a charging current and the current $I_2$ a dischargingcurrent is described below. In a simple reversal, the cycle of process cycle I can also be formed in such a way that the current $I_1$ is a discharging current and the current $I_2$ a charging current. For this, the reference voltage $U_{ref}$ is then preferably placed in one of the parts of the curve of FIG. 1 which contains point 2 or point 3.

In an embodiment of the process according to the present invention, the reference voltage $U_{ref2}$ is approached at the start of the cycle from the same direction as at the end of the cycle. That is to say, at the start of a cycle the reference voltage $U_{ref2}$ is approached from above when the cycle starts with a charging operation, and vice versa. It has proven especially expedient, at the same time, to charge and discharge the battery before the reference voltage $U_{ref2}$ is approached, in such a manner that it has at its terminals such an instantaneous terminal voltage $U_{act}$ that the battery is brought by means of a current $I_{V1}$ to a charging state corresponding to an instantaneous terminal voltage $U_{act}$ which is equal to a reference voltage $U_{ref1}$. Also, the reference voltage $U_{ref2}$ is approached from there by means of a current $I_{V2}$, the currents $I_{V1}$ and $I_{V2}$ having the same direction as the current flowing at the end of the cycle, and the reference voltages $U_{ref1}$ and $U_{ref2}$ being clearly different from one another. An order of magnitude for this difference is obtained, for example, from the fact that the reference voltage $U_{ref1}$ should be approximately at point 2 of the curve of FIG. 1 when the reference voltage $U_{ref2}$ corresponds to point 1 of the curve of FIG. 1. Point 2 should thus be located approximately in the middle of that part of the curve of FIG. 1 which represents the terminal voltage of the battery in the normal operating state.

If it was found in step (1) that the present terminal voltage $U_{act}$ is lower than the reference voltage $U_{ref1}$, the charging/discharging device is first controlled in such a way that the battery is charged until the present terminal voltage of the battery $U_{act}$ is above the reference voltage $U_{ref1}$. Subsequently, in step (2) the charging/discharging device is controlled in such a way that the battery is discharged until the present terminal voltage $U_{act}$ is equal to the reference voltage $U_{ref2}$. Subsequently, there commences in step (3) a cycle in which a specific current $I_1$ flows which is a charging current in the exemplary embodiment described. This charging current flows for a specific time $t_1$.

When the charging time $t_1$ has elapsed, the battery is discharged in step (4) with a specific discharge current $I_2$ until the present terminal voltage $U_{act}$ is again equal to the reference voltage $U_{ref2}$. The time $t_2$ during this step (4) is measured.

At the end of the cycle, the state of the battery is determined, in a step (5), by feeding the measured data to an evaluation unit, in which the current $I_1$ is multiplied by the time $t_1$ during the charging operation, in order thereby to determine the charge $Q_+$ fed to the battery, and in which the current $I_2$ is multiplied by the time $t_2$ during the discharging operation, in order thereby to determine the charge $Q_-$ extracted from the battery. The quotient $Q_{rel}=Q_-/Q_+$ then gives a measure of the state of the battery, a poor state of the battery being deduced from a low quotient.

The quotient $Q_{rel}$ thus represents, as a result of the balance of the charge quantities fed to the battery and extracted from the battery, an indirect measure of the order of magnitude of the conversion of electrical energy into heat energy. The currents $I_1$ and $I_2$ can be, for example, of the order of magnitude of 1A, and the time period $t_1$ can have values of the order of magnitude of 15 min. A suitable limit value $Q_{relSW}$ for the quotient $Q_{rel}$ is approximately 75%, that is to say a battery falling below this limit value is disposed of in an appropriate manner.

It is also possible, however, to match the order of magnitude of the currents $I_1$ and $I_2$ to the conditions of the use of the battery. In other words, batteries that will be loaded with high currents in the operating state are also loaded with relatively high currents during a test according to process cycle I. Consequently, during the test, losses corresponding to the losses in the operating state occur in the battery. The time period $t_1$ then changes accordingly, since, in the process cycle I described in this exemplary embodiment, the maximum terminal voltage should not reach the final charging voltage.

Figure 3A:
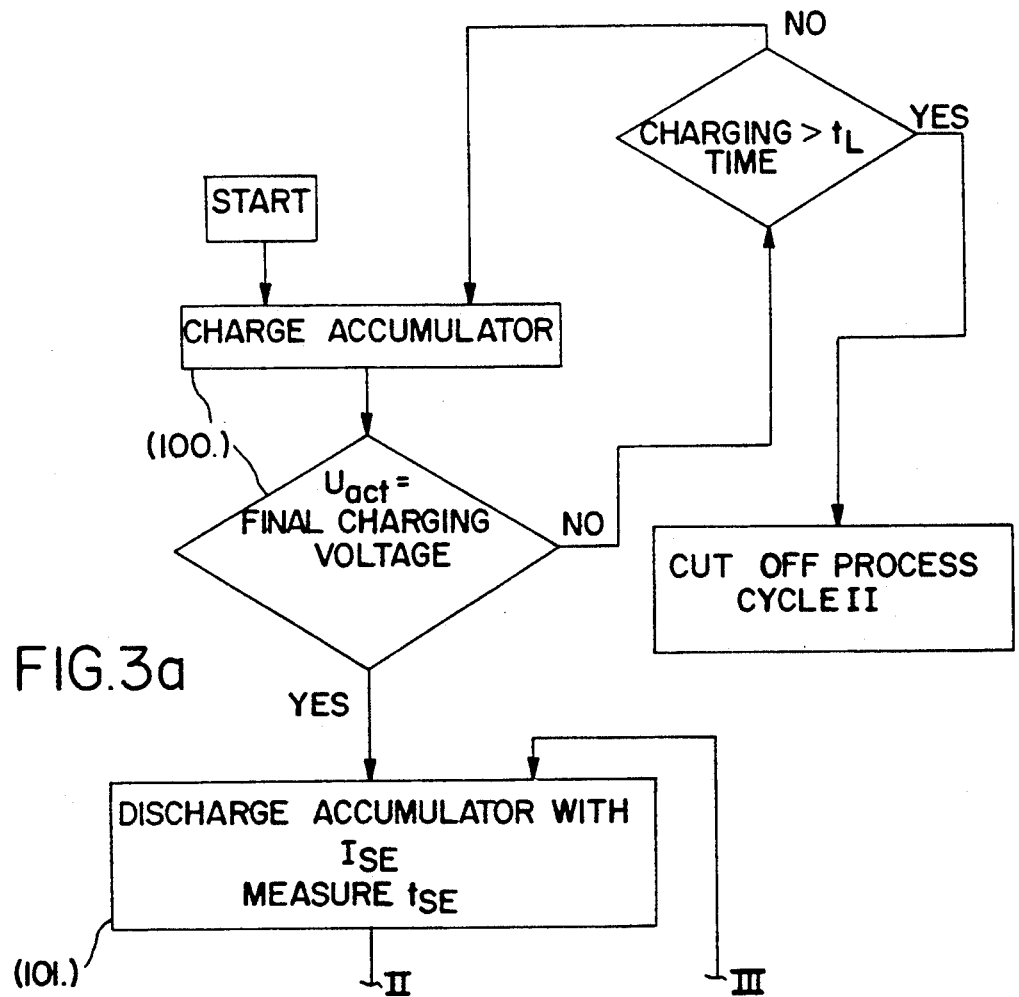
FIGS. 3a and 3b show a single flow diagram of process cycle II of the process according to a second embodiment of the present invention.
Figure 3B:
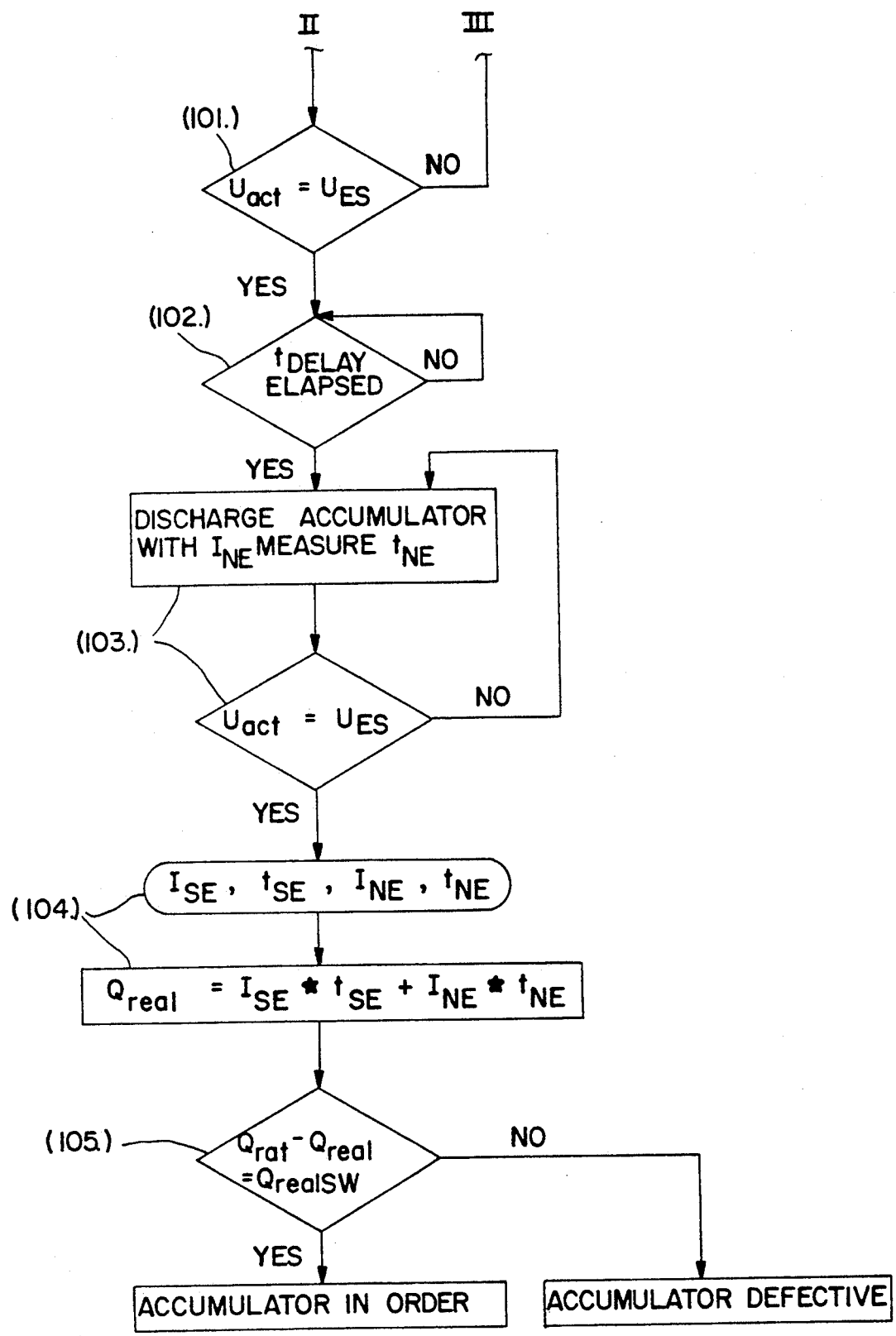

According to the flow diagram of process cycle II shown in FIG. 3, in step (100) the battery is first charged until its terminal voltage $U_{act}$ reaches the final charging voltage which is characterized by point 3 of the curve illustrated in FIG. 1. This charging operation takes place with a current $I_L$ which, in an embodiment of the present invention, is clearly above the rated current of the battery, that is to say the current $I_L$ can amount to approximately 50 times the rated current. If the battery has not yet reached the final charging voltage after a predetermined time $t_L$, process cycle II is cut off. The time $t_L$ can be of the order of magnitude of approximately 1 minute.

After the final charging voltage is reached, in step (101) the battery is discharged with a current $I_{SE}$ until the terminal voltage $U_{act}$ reaches the final discharge voltage $U_{ES}$ which is characterized in FIG. 1 by point 4 of the curve. This point 4 can coincide with point 1 of the curve which characterizes the "specific charging state" in process cycle I. At the same time, the current $I_{SE}$ can be clearly above the rated current of the battery, for example higher by a factor of 50. The surge-like load occurring during the operation of an battery can thereby be simulated. It is also possible, however, to select the current $I_{SE}$ at an order of magnitude which corresponds to the maximum currents occurring relatively frequently under normal operating conditions. The time period $t_{SE}$, during which the current $I_{SE}$ flows, is measured.

In order to detect the remaining capacity occurring after a loading with a high current on the battery by regeneration, in an embodiment of the process according to the invention, the battery is discharged again after a time period $t_{delay}$, during which the battery is regenerated and which is allowed to elapse in step (102), until, in step (103), the present terminal voltage $U_{act}$ has once again reached the final discharge voltage $U_{ES}$ with a current $I_{NE}$ which is preferably of the order of magnitude of the rated current. The time period $t_{NE}$, during which the current $I_{NE}$ flows, is measured.

The measured data are fed in step (104) to an evaluation unit in which the capacity $Q_{real}$ is determined by adding the product $I_{NE}*t_{NE}$ to the product $I_{SE}*t_{SE}$. In step (105), the capacity $Q_{real}$ is compared with the rated capacity $Q_{rat}$ and, if there is a difference above a predeterminable threshold value $Q_{realSW}$, the order or magnitude of which can be selected so that this threshold value is reached when the capacity $Q_{real}$ amounts to exactly 75% of the rated capacity $Q_{rat}$, the battery is detected as no longer operative.

The charging/discharging device and the evaluation unit can be conventional digital computers, the current being output in the appropriate magnitude by the digital computer via a D/A output, and it being possible for the times to be determined by means of a real-time clock present in the digital computer.

The process described is especially suitable for NiCd batteries, but can also be used for other types of batteries. For this, the order of magnitude of the predeterminable currents and times must be matched to the parameters of these batteries. These parameters essentially comprise the desired value of the terminal voltage and the rated capacity of the batteries.

For carrying out process cycle II, the battery must have the final charging voltage at its terminals or be chargeable to the final charging voltage. By carrying out process cycle I it is also possible to test batteries which no longer reach the final charging voltage. One possibility of using the two process cycles described is, for example, first to test whether the battery can reach the final charging voltage at its terminals. If this is so, the battery is tested by carrying out process cycle II. If this is not so, the battery is tested by carrying out process cycle I. However, by carrying out process cycle I it is also possible to test batteries which reach the final charging voltage, that is to say process cycle I can also take place independently of process cycle II.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A process for determining the state of a battery comprising:
   controlling a charging/discharging device to place the battery in a specific charging state in which an instantaneous terminal voltage $U_{act}$ is equal to a predeterminable reference value $U_{ref2}$;
   generating a first signal when the battery has reached the specific charging state;
   controlling the charging/discharging device as a function of the first signal such that, during a specific time period $t_1$, a specific current $I_1$ flows, the direction of the specific current $I_1$ corresponding to a discharging operation;
   generating a second signal which controls the charging/discharging device such that a specific current $I_2$, the direction of the specific current $I_2$ corresponding to a charging operation, flows for a time period $t_2$ until the battery is again in the specific charging state;

measuring the time period $t_2$, during which the specific current $I_2$ flows; and providing measured data fed to an evaluation unit in which an order of magnitude of the conversion of electrical energy into heat energy is deduced from a deviation of the time $t_2$ from the time $t_1$.

2. The process according to claim 1, wherein the currents $I_1$ and $I_2$ are equal.

3. The process according to claim 2, wherein the currents $I_1$ and $I_2$ are of an order of magnitude which corresponds to maximum currents occurring relatively frequently under customary operating conditions of the battery.

4. The process according to claim 3, wherein the time period $t_1$ is of the order of magnitude of 15 min.

5. The process according to claim 4, wherein the specific charging state of the battery is approached, at the start of a cycle, by a current having a direction that is identical to the direction of the current $I_2$.

6. The process according to claim 5, further comprising initially charging or discharging the battery to a charging state in which an instantaneous terminal voltage $U_{act}$ has such a value that, starting from this charging state, a present terminal voltage $U_{act}$ of the battery is brought by a current $I_{V1}$ to a value which is equal to a reference voltage $U_{ref1}$, and in that, starting from this charging state, the present terminal voltage $U_{act}$ of the battery is brought by a current $I_{V2}$, at the start of the cycle, to a value which is equal to the reference voltage $U_{ref2}$, the currents $I_{V1}$ and $I_{V2}$ each having the same direction as the current $I_2$, the reference voltage $U_{ref1}$ being different from the reference voltage $U_{ref2}$.

7. The process according to claim 6, wherein the currents $I_{V1}$ and $I_{V2}$ are of the order of magnitude of the rated current of the battery.

8. The process according to claim 7, further comprising determining a relative capacity $Q_{rel}$ that represents the state of the battery by multiplying the current $I_1$ flowing during the discharging operation by the associated time $t_1$, and by dividing a resulting charge $Q_-$, extracted from the battery, by the charge $Q_+$ fed to the battery and obtained by multiplying the current $I_2$ flowing during the charging operation by the associated time $t_2$, and in that a low relative capacity $Q_{rel}$ corresponds to a poor state of the battery.

9. The process according to claim 8, wherein a threshold value $Q_{relSW}$ is defined for the relative capacity $Q_{rel}$, the battery being detected as no longer operative when its relative capacity $Q_{rel}$ falls below the threshold value $Q_{relSW}$.

10. A process for determining the state of a battery comprising:

controlling a charging/discharging device to place the battery in a specific charging state in which an instantaneous terminal voltage $U_{act}$ is equal to a predeterminable reference value $U_{ref2}$;

generating a first signal when the battery has reached the specific charging state;

controlling the charging/discharging device as a function of the first signal such that, during a specific time period $t_1$, a specific current $I_1$ flows, the direction of the specific current $I_1$ corresponding to a charging operation;

generating a second signal which controls the charging/discharging device such that a specific current $I_2$, the direction of the specific current $I_2$ corresponding to a discharging operation, flows for a time period $t_2$ until the battery is again in the specific charging state such that the instantaneous terminal voltage $U_{act}$ is equal to the predeterminable reference value $U_{ref2}$;

measuring the time period $t_2$, during which the specific current $I_2$ flows; and providing measured data fed to an evaluation unit in which an order of magnitude of the conversion of electrical energy into heat energy is deduced from a deviation of the time $t_2$ from the time $t_1$.

11. The process according to claim 10, wherein the currents $I_1$ and $I_2$ are equal.

12. The process according to claim 11, wherein the currents $I_1$ and $I_2$ are of an order of magnitude which corresponds to maximum currents occurring relatively frequently under customary operating conditions of the battery.

13. The process according to claim 12, wherein the time period $t_2$ is of the order of magnitude of 15 min.

14. The process according to claim 13, wherein the specific charging state of the battery is approached, at the start of a cycle, by a current having a direction that is identical to the direction of the current $I_2$.

15. The process according to claim 14, further comprising initially charging or discharging the battery to a charging state in which an instantaneous terminal voltage $U_{act}$ has such a value that, starting from this charging state, a present terminal voltage $U_{act}$ of the battery is brought by a current $I_{V1}$ to a value which is equal to a reference voltage $U_{ref1}$, and in that, starting from this charging state, the present terminal voltage $U_{act}$ of the battery is brought by a current $I_{V2}$, at the start of the cycle, to a value which is equal to the reference voltage $U_{ref2}$, the currents $I_{V1}$ and $I_{V2}$ each having the same direction as the current $I_2$, the reference voltage $U_{ref1}$ being different from the reference voltage $U_{ref2}$.

16. The process according to claim 15, wherein the currents $I_{V1}$ and $I_{V2}$ are of the order of magnitude of the rated current of the battery.

17. The process according to claim 16, further comprising determining a relative capacity $Q_{rel}$ that represents the state of the battery by multiplying the current $I_2$ flowing during the discharging operation by the associated time $t_2$, and by dividing a resulting charge $Q_-$, extracted from the battery, by the charge $Q_+$ fed to the battery and obtained by multiplying the current $I_1$ flowing during the charging operation by the associated time $t_1$, and in that a low relative capacity $Q_{rel}$ corresponds to a poor state of the battery.

18. The process according to claim 17, wherein a threshold value $Q_{relSW}$ is defined for the relative capacity $Q_{rel}$, the battery being detected as no longer operative when its relative capacity $Q_{rel}$ falls below the threshold value $Q_{relSW}$.

19. A process for determining the state of a battery, the battery being initially in a state I in which the battery has a final charging voltage at its terminals, comprising:

generating a signal that controls a charging/discharging device to change the battery from state I to a state II by a first discharge current $I_{SE}$ for a time period $t_{SE}$, the battery in state II having a final discharge voltage $U_{ES}$ at its terminals, and the first discharge current $I_{SE}$ being clearly above a rated current $I_{rat}$ of the battery;

measuring the time period $t_{SE}$ during which the discharge current $I_{SE}$ flows;

feeding measured data to an evaluation unit;

determining in the evaluation unit a capacity $Q_{real}$ of the battery by multiplying the first discharge current $I_{SE}$ by the time period $t_{SE}$, and deducing a state of the battery from a deviation of the specific capacity $Q_{real}$ from a rated capacity $Q_{rat}$;

controlling the charging/discharging device, after the changeover of the battery to the state II by the first discharge current $I_{SE}$ flowing during the time period $t_{SE}$, for a time period delay $t_{delay}$, such that neither a charging or a discharging current flows;

controlling the charging/discharging device, after the time period $t_{delay}$, such that a second discharge current $I_{NE}$ flows for a time period $t_{NE}$ until the battery returns to the state II;

measuring the time period $t_{NE}$ during which the current $I_{NE}$ flows;

feeding the measured data to the evaluation unit and calculating the specific capacity $Q_{real}$ by adding the product $I_{NE}*t_{NE}$ to the product $I_{SE}*t_{SE}$.

20. The process according to claim 19, wherein the discharge current $I_{SE}$ is of an order of magnitude which corresponds to maximum currents occurring relatively frequently under customary operating conditions of the battery.

21. The process according to claim 20, further comprising comparing the calculated capacity $Q_{rel}$ with the rated capacity $Q_{rat}$, and in the event of a deviation of the capacity $Q_{rel}$ from the rated capacity $Q_{rat}$ above a threshold value, the battery is detected as no longer operative.

22. The process according to claim 21, further comprising: when the battery has an instantaneous terminal voltage $U_{act}$ below the final charging voltage, at the start of process cycle II, charging the battery with a current $I_L$ until the instantaneous terminal voltage $U_{act}$ is equal to the final charging voltage, and cutting off the process cycle II when the current $I_L$ flows for longer than a predetermined time $t_L$.

23. The process according to claim 22, wherein the current $I_L$ is clearly above the rated current of the battery.

24. The process according to claim 23, wherein the time $t_L$ is of the order of magnitude of one minute.

* * * * *